United States Patent
Yagi

(10) Patent No.: US 8,629,444 B2
(45) Date of Patent: Jan. 14, 2014

(54) CIRCUIT BOARD, METHOD OF MANUFACTURING CIRCUIT BOARD, DISPLAY, AND ELECTRONIC UNIT

(75) Inventor: Iwao Yagi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/556,955

(22) Filed: Jul. 24, 2012

(65) Prior Publication Data

US 2013/0032807 A1 Feb. 7, 2013

(30) Foreign Application Priority Data

Aug. 2, 2011 (JP) ................................. 2011-168967

(51) Int. Cl.
- *H01L 29/04* (2006.01)
- *H01L 31/20* (2006.01)
- *H01L 31/036* (2006.01)
- *H01L 31/0376* (2006.01)

(52) U.S. Cl.
USPC ................................ 257/59; 257/40; 438/479

(58) Field of Classification Search
USPC ........................... 257/40, 59, 66, 72, E51.003
See application file for complete search history.

(56) References Cited

U.S. PATENT DOCUMENTS

| 8,182,072 B2 * | 5/2012 | Ibe et al. ........................ 347/63 |
| 2008/0050851 A1 * | 2/2008 | Tanaka et al. .................. 438/29 |
| 2011/0156042 A1 * | 6/2011 | Miyairi et al. ................. 257/59 |

FOREIGN PATENT DOCUMENTS

| JP | 2008-147614 | 6/2008 |
| JP | 2011-014724 | 1/2011 |

* cited by examiner

*Primary Examiner* — Phuc Dang
(74) *Attorney, Agent, or Firm* — Sheridan Ross P.C.

(57) ABSTRACT

A circuit board includes: a first wiring layer provided on a substrate; an insulating layer including an opening, the insulating layer being provided on the first wiring layer; a surface-energy control layer provided in a region opposed to the opening of the insulating layer on the first wiring layer, the surface-energy control layer controlling surface energy of the first wiring layer; a semiconductor layer provided in a selective region on the insulating layer; and a second wiring layer on the insulating layer, the second wiring layer being electrically connected to the semiconductor layer, and being electrically connected to the first wiring layer through the opening.

18 Claims, 12 Drawing Sheets

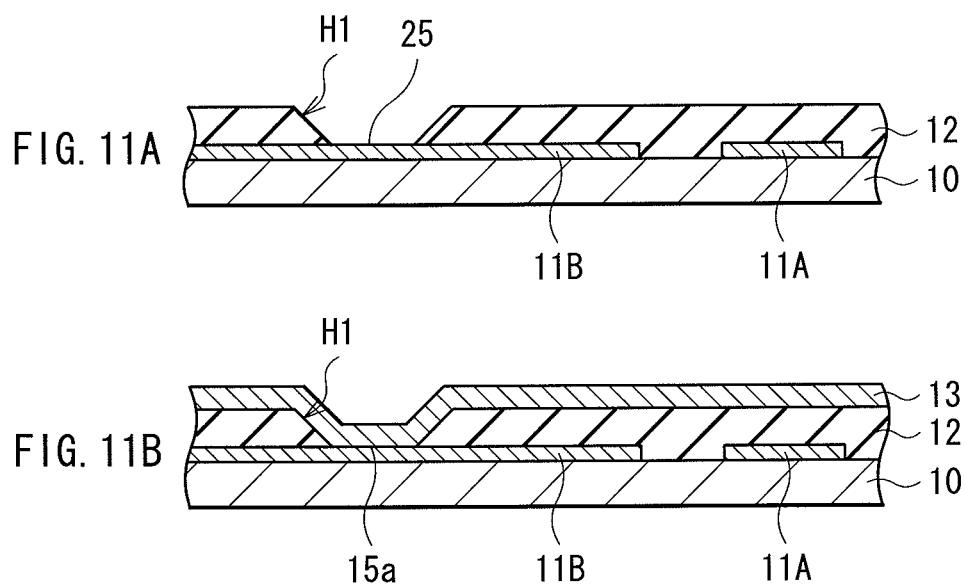

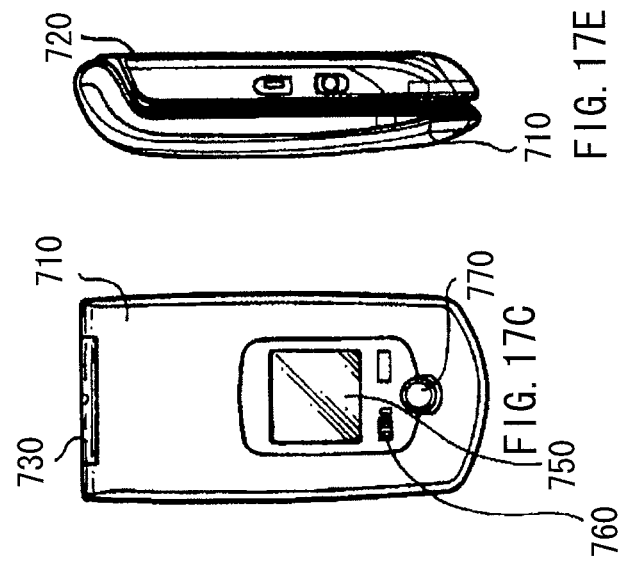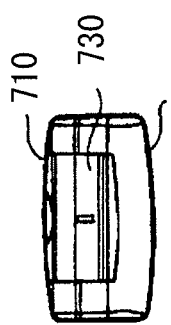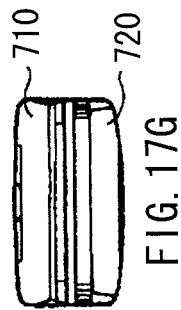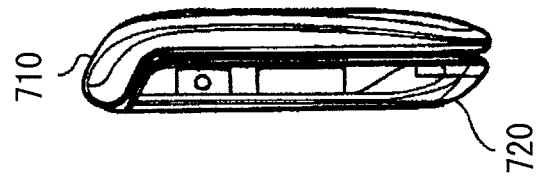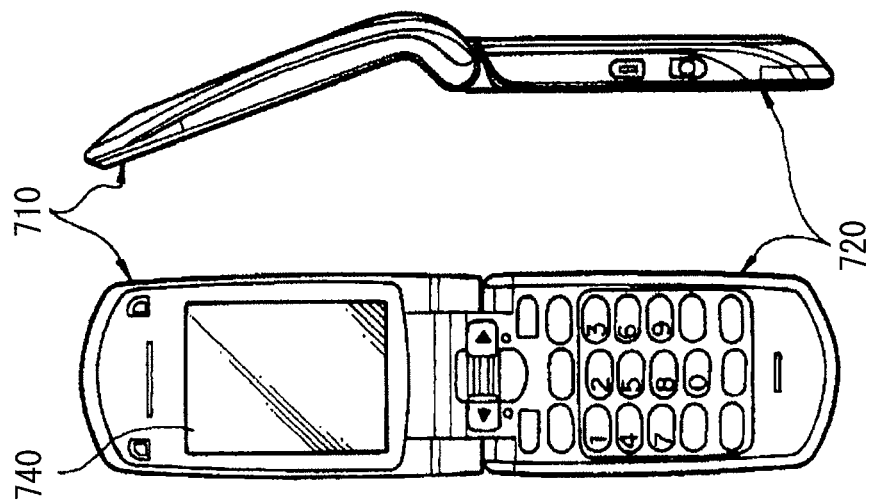

CIRCUIT BOARD, METHOD OF MANUFACTURING CIRCUIT BOARD, DISPLAY, AND ELECTRONIC UNIT

CROSS REFERENCES TO RELATED APPLICATIONS

The present application claims priority to Japanese Priority Patent Application JP 2011-168967 filed in the Japan Patent Office on Aug. 2, 2011, the entire content of which is hereby incorporated by reference.

BACKGROUND

The present disclosure relates to a circuit board preferably used as a backplane including, for example, a thin film transistor (TFT).

A thin film transistor (hereinafter, referred to as TFT) typically has three electrodes (terminals) called a gate (G) electrode, a source (S) electrode, and a drain (D) electrode. The source and drain electrodes are provided in the same layer, while the gate electrode is provided in a different layer from that layer.

In the case where a large number of TFTs are integrated to achieve a circuit function, a wiring layer provided in the same layer as that of a source or a drain and a wiring layer provided in the same layer as that of a gate need to be electrically connected to each other. Specifically, there is a need of electric connection between wirings in different layers (a need of interlayer wiring connection). For example, a wiring layer in the same layer as that of the gate electrode is connected to a wiring layer leading to the source or drain in a portion outside the TFT. Various interlayer wiring connection techniques have been previously proposed for the circuit including TFTs (see, for example, Japanese Unexamined Patent Application Publication Nos. 2011-14724 and 2008-147614).

SUMMARY

To establish the interlayer wiring connection as described above, since an insulating layer exists between the two wiring layers, an opening (a contact hole) is provided in part of the insulating layer to establish connection between the wirings through the opening.

However, particularly, in the case where a semiconductor layer of TFT is formed by coating, deposition failure occurs in the opening portion, leading to a reduction in pattern accuracy of the semiconductor layer.

It is desirable to provide a circuit board that allows a semiconductor layer to be accurately patterned and a method of manufacturing the circuit board, and a display including the circuit board.

A circuit board according to an embodiment of the disclosure includes: a first wiring layer provided on a substrate; an insulating layer including an opening, the insulating layer being provided on the first wiring layer; a surface-energy control layer provided in a region opposed to the opening of the insulating layer on the first wiring layer, the surface-energy control layer controlling surface energy of the first wiring layer; a semiconductor layer provided in a selective region on the insulating layer; and a second wiring layer on the insulating layer, the second wiring layer being electrically connected to the semiconductor layer, and being electrically connected to the first wiring layer through the opening.

A method of manufacturing a circuit board according to an embodiment of the disclosure includes: forming a first wiring layer on a substrate; forming an insulating layer having an opening on the first wiring layer; forming a surface-energy control layer in a region opposed to the opening of the insulating layer on the first wiring layer, the surface-energy control layer controlling surface energy of the first wiring layer; forming a semiconductor layer in a selective region on the insulating layer after forming the surface-energy control layer; and forming a second wiring layer on the insulating layer, the second wiring layer being electrically connected to the semiconductor layer, and electrically connected to the first wiring layer through the opening.

In the circuit board and the method of manufacturing a circuit board according to the embodiments of the disclosure, the second wiring layer is provided on the first wiring layer with the insulating layer having the opening therebetween, so that the first and second wiring layers are electrically connected to each other through the opening of the insulating layer. Here, the surface-energy control layer is provided in the region opposed to the opening on the first wiring layer, so that surface energy of the first wiring layer is controlled in the opening region. Consequently, when the semiconductor layer is formed by coating on the insulating layer, deposition failure such as uneven thickness of the semiconductor layer is less likely to occur.

A display according to an embodiment of the disclosure includes:

a display section including a plurality of pixels; and a circuit board driving the display section. The circuit board includes: a first wiring layer provided on a substrate; an insulating layer including an opening, the insulating layer being provided on the first wiring layer; a surface-energy control layer provided in a region opposed to the opening of the insulating layer on the first wiring layer, the surface-energy control layer controlling surface energy of the first wiring layer; a semiconductor layer provided in a selective region on the insulating layer; and a second wiring layer on the insulating layer, the second wiring layer being electrically connected to the semiconductor layer, and being electrically connected to the first wiring layer through the opening.

An electronic unit includes: a display including a display section including a plurality of pixels, and a circuit board driving the display section. The circuit board includes: a first wiring layer provided on a substrate; an insulating layer including an opening, the insulating layer being provided on the first wiring layer; a surface-energy control layer provided in a region opposed to the opening of the insulating layer on the first wiring layer, the surface-energy control layer controlling surface energy of the first wiring layer; a semiconductor layer provided in a selective region on the insulating layer; and a second wiring layer on the insulating layer, the second wiring layer being electrically connected to the semiconductor layer, and being electrically connected to the first wiring layer through the opening.

According to the circuit board and the method of manufacturing a circuit board according to the embodiments of the disclosure, the second wiring layer is provided on the first wiring layer with the insulating layer having the opening therebetween, so that the first and second wiring layers are electrically connected to each other through the opening of the insulating layer. In addition, the surface-energy control layer is provided in the region opposed to the opening on the first wiring layer, so that surface energy of the first wiring layer is allowed to be controlled, leading to suppression of deposition failure of the semiconductor layer. This allows a semiconductor layer to be accurately patterned.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 11A and 11B are schematic sectional illustrations of a method of manufacturing a circuit board according to a second modification.

FIG. 17A is a front view of application example 5 in an opened state, FIG. 17B is a side view thereof, FIG. 17C is a front view thereof in a closed state, FIG. 17D is a left side view thereof, FIG. 17E is a right side view thereof, FIG. 17F is a top view thereof, and FIG. 17G is a bottom view thereof.

DETAILED DESCRIPTION

An embodiment of the disclosure will now be described in detail with reference to the accompanying drawings. It is to be noted that description is made in the following order.

1. Embodiment (example of circuit board having organic TFT)
2. First Modification (another example of manufacturing process)
3. Second Modification (further example of manufacturing process)
4. Application Examples (examples of display and electronic units including circuit board)

Embodiment

[Configuration of Circuit Board]

Figure 1:
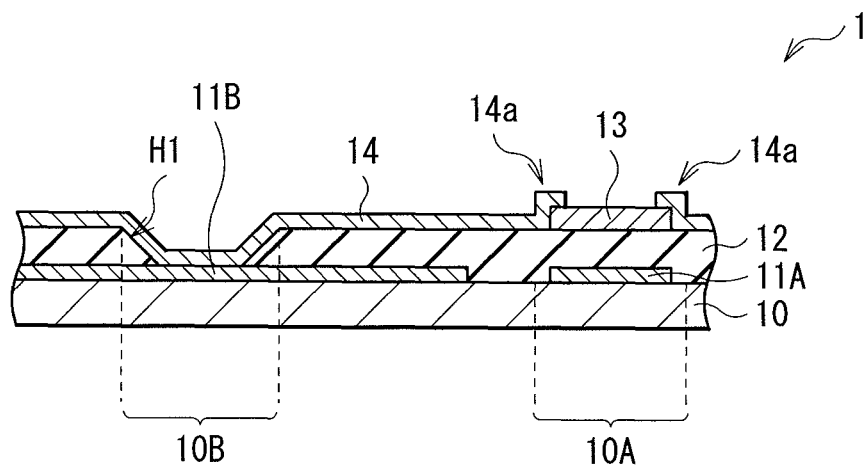
FIG. 1 is a sectional view illustrating a schematic configuration of a circuit board according to an embodiment of the disclosure.

FIG. 1 is a perspective view illustrating a schematic configuration of a circuit board (circuit board 1) according to an embodiment of the disclosure. The circuit board 1 is preferably used as a so-called backplane, for example. The circuit board 1 includes, for example, one or a plurality of driver semiconductor devices (for example, active devices such as thin film transistors) being integrated. Such a circuit board 1 has, for example, a layer structure where wirings provided in different layers are connected to each other (interlayer wiring connection is established) in a portion outside each semiconductor device. The embodiment is described with a structure, as an exemplary layer structure of such a backplane, where interlayer wiring connection is established in a portion (wiring connection section 10B) outside a thin film transistor (transistor section 10A) including an organic semiconductor.

The transistor section 10A includes, for example, an organic TFT having, as it is called, a bottom-gate structure and a top-contact structure. The transistor section 10A has a gate electrode 11A in a selective region on a substrate 10, and has a semiconductor layer 13 on the gate electrode 11A with a gate insulating layer 12 therebetween. The semiconductor layer 13 is provided being patterned in a selective region opposed to the gate electrode 11A on the gate insulating layer 12. A pair of source/drain electrodes 14a are provided on the semiconductor layer 13 while being connected to the semiconductor layer 13.

The wiring connection section 10B is a connection region between a first wiring layer 11B and a second wiring layer 14, which are provided in different layers. In the wiring connection region 10B, an opening H1 (a contact hole through the gate insulating layer 12) is provided in another layer (here, the gate insulating layer 12) between the first wiring layer 11B and the second wiring layer 14. In the wiring connection section 10B, the first wiring layer 11B is electrically connected to the second wiring layer 14 through the opening H1. In detail, a surface-energy control layer 15 described below is provided in a portion opposed to the opening H1 on the first wiring layer 11B.

It is to be noted that the opening H1 is not limited to a hole-shaped opening that draws a closed curve on the surface or back of the gate insulating layer 12. Specifically, the concept of the opening H1 is a wide concept including a notch, a groove, and the like. Thus, the opening H1 may not necessarily draw a closed curve as long as part of the gate insulating layer 12 is removed.

The first wiring layer 11B is provided in the same layer (on the substrate 10) as that of the gate electrode 11A in the transistor section 10A. The second wiring layer 14 is provided in the same layer as that of the source/drain electrodes 14a in the transistor section 10A (or the source/drain electrodes 14a are formed as part of the second wiring layer 14). In the embodiment, the gate electrode 11A and the first wiring layer 11B are formed to be patterned in the same step, and the source/drain electrodes 14a and the second wiring layer 14 are formed to be patterned in the same step.

The substrate 10 includes, for example, a plastic sheet including polyimide, polyethylene terephthalate, polyether sulfone, polyethylene naphthalate, polycarbonate, and liquid crystal polymer, or a metal sheet including stainless steel, aluminum (Al), and copper (Cu), of which surface is subjected to insulation treatment.

The gate electrode 11A controls carrier density in the semiconductor layer 13 by a gate voltage (Vg) applied to the transistor section 10A, and functions as a wiring supplying an electric potential. The gate electrode 11A (and the first wiring layer 11B) preferably includes a conductive film material having a surface on which an oxide film is readily formed. The reason for this is as follows. The first wiring layer 11B is formed in the same step as that of the gate electrode 11A and therefore includes the same material as that of the gate electrode 11A, and the surface of the first wiring layer 11B is oxidized for forming the surface-energy control layer 15 in the embodiment, as described in detail below. Examples of such a conductive film material includes a single-layer film including one of aluminum, titanium (Ti), platinum (Pt), gold (Au), palladium (Pd), chromium (Cr), nickel (Ni), molybdenum (Mo), niobium (Nb), neodymium (Nd), rubidium (Rb), rhodium (Rh), aluminum (Al), silver (Ag), tantalum (Ta), tungsten (W), copper, indium (In), and tin (Sn), or a stacked film including two or more of them. While various materials are used for the first wiring layer 11B as described above, the surface of the first wiring layer 11B may need to be oxidized in a manufacturing process described below. In view of this, an oxidizable material is desirably used for the first wiring layer 11B.

Examples of the gate insulating layer 12 include a single-layer film including one of polyvinyl phenol, diallyl phthalate, polyimide, polymethyl methacrylate, polyvinyl alcohol, polyester, polyethylene, polycarbonate, polyamide, polyamide-imide, polyetherimide, polysiloxane, polymethacrylamide, polyurethane, polybutadiene, polystyrene, polyvinyl chloride, nitrile rubber, acrylic rubber, butyl rubber, epoxy resin, phenolic resin, melamine resin, urea resin, novolac resin, fluorinated resin, or a stacked film including two or more of them. The gate insulating layer 12 is formed by coating and then patterned by etching. The gate insulating layer 12, however, can be patterned using a printing technique such as inkjet printing, screen printing, offset printing, and gravure depending on materials.

The semiconductor layer 13, which forms a channel in response to an applied gate voltage, includes, for example, an organic semiconductor such as a peri-Xanthenoxanthene (PXX) derivative. Examples of the organic semiconductor material further includes derivatives of one of pentacene, naphthacene, hexacene, heptacene, pyrene, chrysene, perylene, coronene, rubrene, polythiophene, polyacene, polyphenylene vinylene, polypyrrole, porphyrin, carbon nanotube, fullerene, grapheme, and metal phthalocyanine, and a mixture of two or more of them. The semiconductor layer 13 is formed by depositing the above-described material by a coating process such as a spin coat process and a slit coat process, and then patterning the deposited material.

A pair of source/drain electrodes 14a are each electrically connected to the semiconductor layer 13, and are electrically isolated from each other on the semiconductor layer 13. Each of the source/drain electrodes 14a functions as the source or drain electrode, and is configured of the equivalent conductive-film material to each of those listed for the gate electrode 11A.

Each of the source/drain electrodes 14a is configured to be part of the second wiring layer 14, or is provided in the same layer as that of the second wiring layer 14. Here, a part of the second wiring layer 14 overlaps the semiconductor layer 13, which functions as one of the source/drain electrodes 14a. The second wiring layer 14 includes, for example, the same material as that of the source/drain electrodes 14a, and is patterned in the same step as that of the source/drain electrodes 14a.

Figure 2:
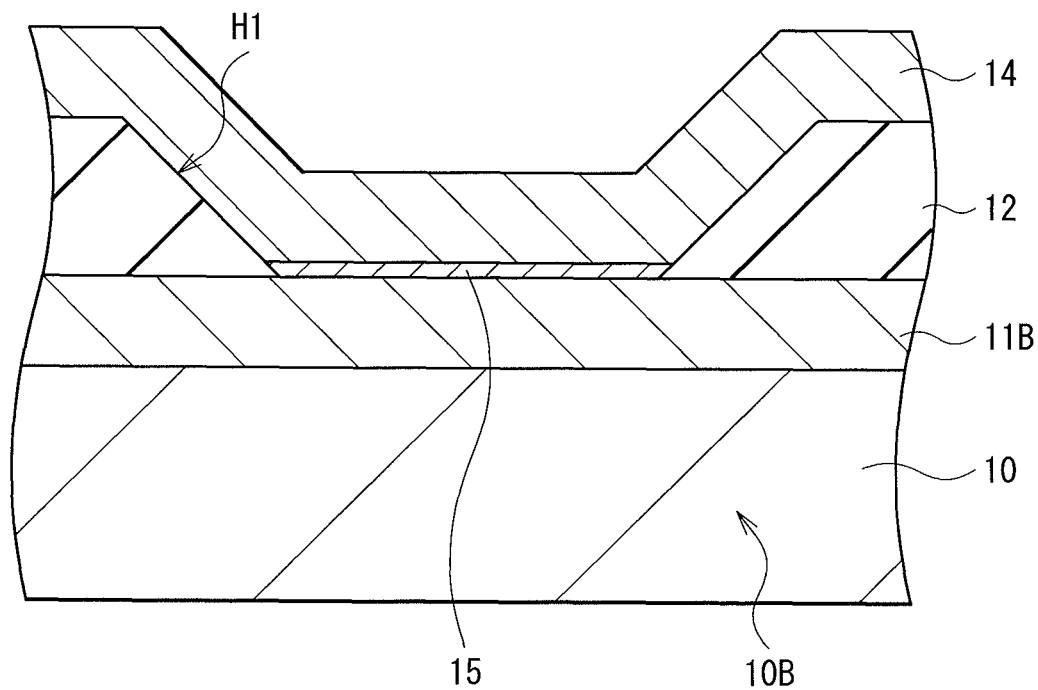
FIG. 2 is a schematic sectional view illustrating a portion in the vicinity of a wiring connection section of the circuit board shown in FIG. 1 in an enlarged manner.

In such a circuit board 1 of the embodiment, the wiring connection section 10B has the surface-energy control layer 15 in a region opposed to the opening H1 on the surface of the first wiring layer 11B. FIG. 2 illustrates a portion in the vicinity of the wiring connection section 10B in an enlarged manner. As shown in the drawing, in detail, the surface-energy control layer 15 is interposed between the first wiring layer 11B and the second wiring layer 14.

The surface-energy control layer 15 has a function of controlling the surface energy of the first wiring layer 11B, specifically, a function of controlling the surface energy of the first wiring layer 11B to be smaller than or substantially equal to that of the gate insulating layer 12. In the embodiment, the surface-energy control layer 15 has a function of controlling the surface energy of the first wiring layer 11B to be smaller than that of the gate insulating layer 12 (controlling the surface of the first wiring layer 11B to be less wettable than that of the gate insulating layer 12). In other words, a difference in wettability is large between the first wiring layer 11B and the gate insulating layer 12, and liquid repellency is relatively high on the surface of the first wiring layer 11B (in detail, on the top of the surface-energy control layer 15), while lyophilicity is relatively high on the surface of the gate insulating layer 12. The surface-energy control layer 15 has a thickness of, for example, about 1 nm to 2 nm both inclusive, which is extremely thin compared with the thickness of the first wiring layer 11B or the second wiring layer 14.

While the surface-energy control layer 15 should be configured of a thin film having the above-described function, the surface-energy control layer 15 in the embodiment includes, for example, silicon or organic silicide. The reason for this is as follows. An oxide film is formed on the surface of the first wiring layer 11B, which is then reacted with a silane coupling agent in order to form the surface-energy control layer 15, as described in detail below.

[Method of Manufacturing Circuit Board 1]

FIG. 3A to FIG. 6C are schematic illustrations of a method of manufacturing the circuit board 1. The circuit board 1 is manufactured, for example, in the following way.

Figure 3A:
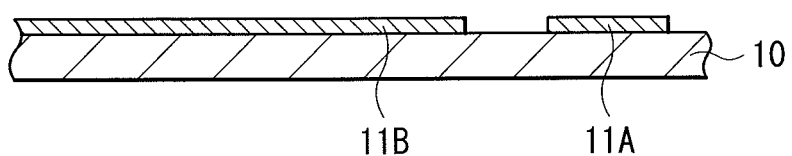
FIGS. 3A to 3C are sectional views illustrating a method of manufacturing the circuit board shown in FIG. 1 in a step order.

As shown in FIG. 3A, the gate electrode 11A and the first wiring layer 11B are collectively formed in selective regions on the substrate 10. In detail, the above-described conductive-film material, for example, aluminum or titanium is deposited on the entire surface of the substrate 10 by, for example, a sputtering process, and then the conductive film is etched into a predetermined pattern by a photolithography process, for example.

Figure 3B:
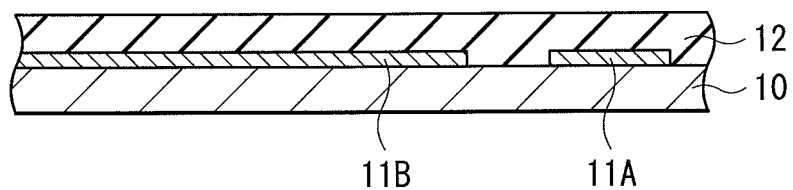

As shown in FIG. 3B, the gate insulating layer 12 is then formed over the entire surface of the substrate 10. In detail, the above-described material for the gate insulating layer, for example, a polyvinyl pyrrolidone (PVP) solution is applied over the entire surface of the substrate 10 by, for example, a spin coat process, and then dried.

Figure 3C:
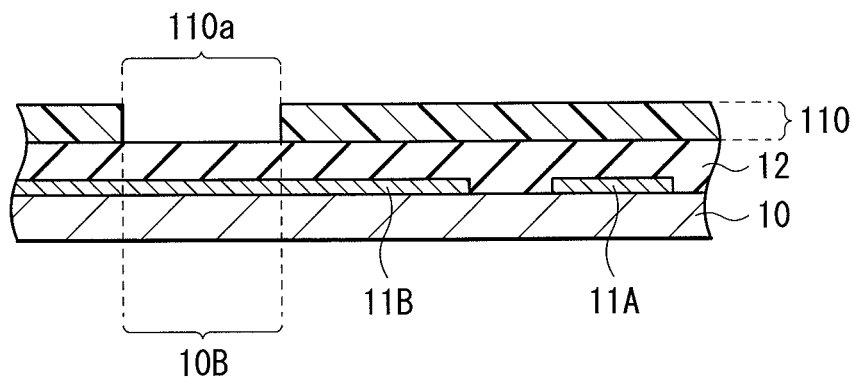

As shown in FIG. 3C, for example, a positive-type photosensitive resin material is then applied on the gate insulating layer 12, and then a photoresist film 110 having an opening 110a in a region corresponding to the wiring connection section 10B is formed through steps including exposure and development.

Figure 4A:
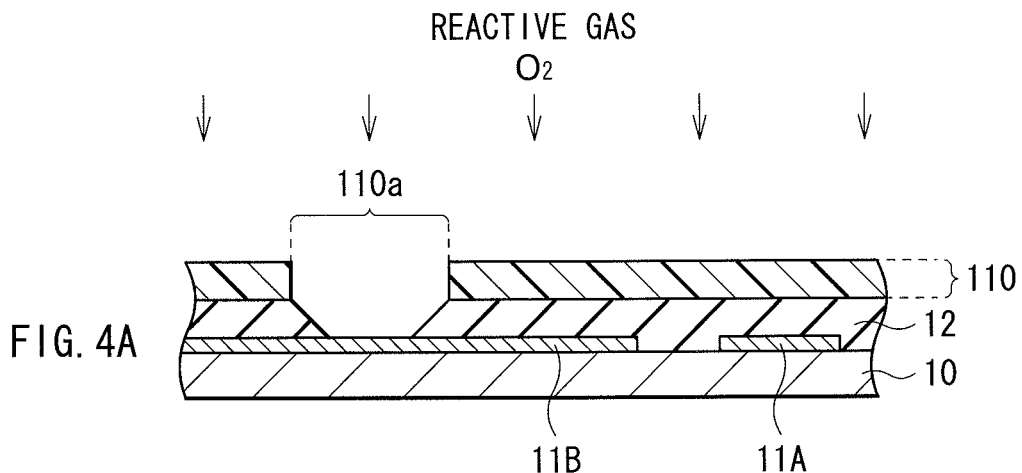
FIGS. 4A and 4B are sectional views illustrating steps following FIG. 3C.

As shown in FIG. 4A, a selective region of the gate insulating layer 12 is then etched with the photoresist film 110 as a mask. This process is performed through, for example, dry etching using oxygen ($O_2$) as a reactive gas. For example, the dry etching using oxygen gas is preferable for the gate insulating layer 12 formed of PVP as described above.

Figure 4B:
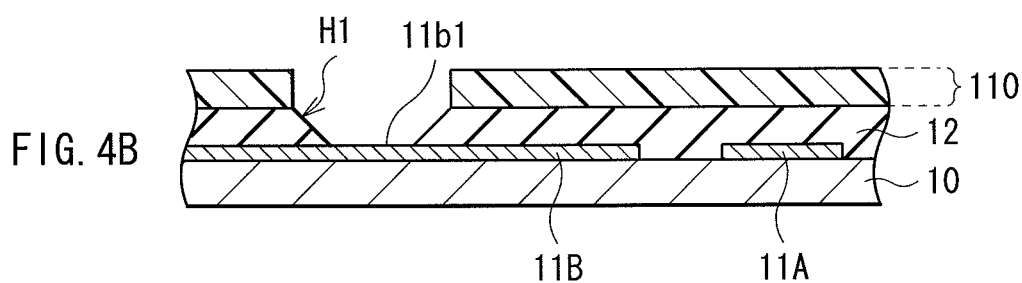

In this way, the gate insulating layer 12 is etched. Thus, as shown in FIG. 4B, the surface of the first wiring layer 11B is exposed, resulting in formation of the opening H1 in the gate insulating layer 12. During this process in the embodiment, the surface of the first wiring layer 11B is oxidized by the oxygen gas (an oxide film 11b1 is formed on the surface of the first wiring layer 11B). For example, in the case where aluminum or titanium is used for the first wiring layer 11B (and the gate electrode 11A), aluminum oxide (AlO) or titanium oxide ($TiO_x$) is formed as the oxide film 11b1.

Figure 5A:
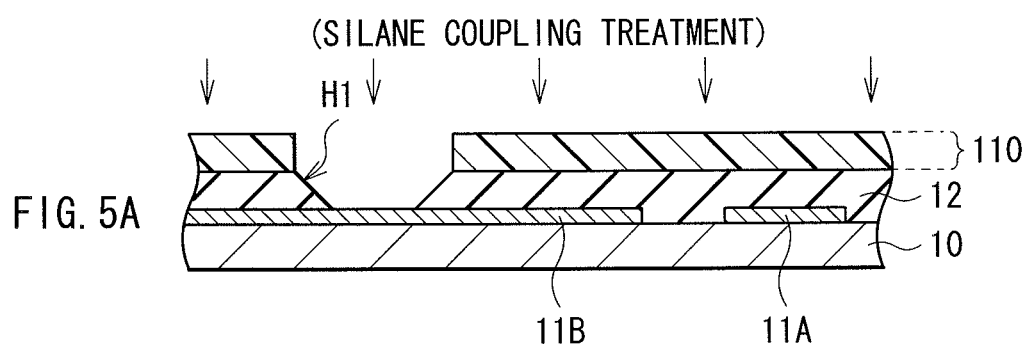
FIGS. 5A and 5B are sectional views illustrating steps following FIG. 4B.

As shown in FIG. 5A, silane coupling treatment is then performed. In detail, the substrate 10, on which the gate insulating layer 12 having the opening H1 is provided as described above, is dipped in a silane coupling agent. This results in a selective reaction of the silane coupling agent with the oxide film 11b1 provided on the surface of the first wiring layer 11B. Consequently, the surface-energy control layer 15 including silicon or organic silicide as described above is formed only on the surface of the first wiring layer 11B. It is to be noted that, while the silane coupling agent may adhere on the photoresist film 110, the photoresist film 110 is finally separated as described below. Examples of the silane coupling agent include octadecyltrichlorosilane (OTS).

Figure 5B:
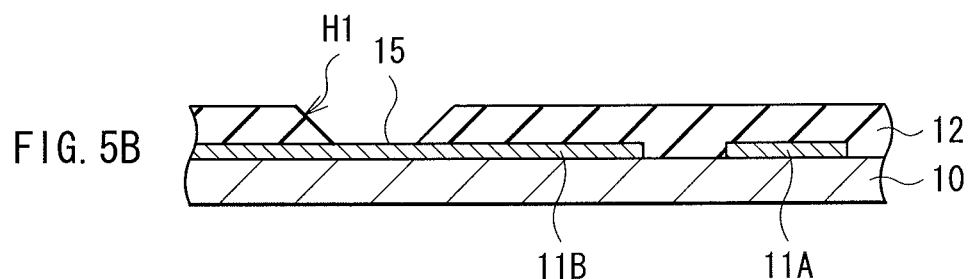

As shown in FIG. 5B, the photoresist film 110 is then separated. As a result, the surface of the gate insulating layer 12 is exposed, while the surface of the first wiring layer 11B in the opening H1 is covered with the surface-energy control layer 15. In the embodiment, the surface-energy control layer 15 controls the surface energy of the first wiring layer 11B to be smaller than that of the gate insulating layer 12. Specifically, the first wiring layer 11B exposed from the opening H1 is less wettable than the gate insulating layer 12.

Figure 6A:
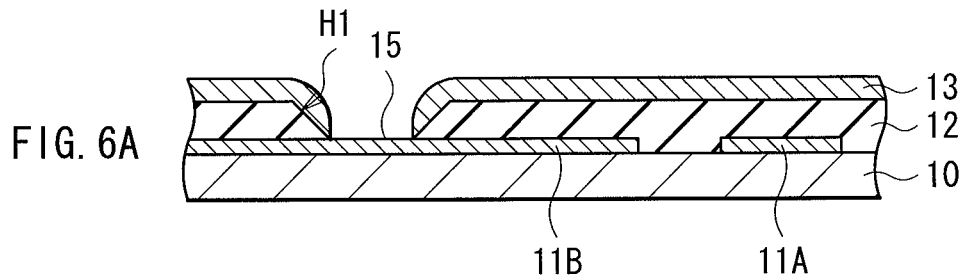
FIGS. 6A to 6C are sectional views illustrating steps following FIG. 5B.

The semiconductor layer 13 is then formed to be patterned on the gate insulating layer 12. In this operation, as shown in FIG. 6A, an organic semiconductor material, for example, a peri-Xanthenoxanthene compound solution is applied over the entire surface of the substrate 10. The organic semiconductor material is likely to adhere only on the gate insulating layer 12 while being repelled on the first wiring layer 11B. This is due to a difference in surface energy between the first wiring layer 11B and the gate insulating layer 12 as described above. The applied organic semiconductor material is then heated, thereby the semiconductor layer 13 having a substantially uniform thickness is formed on the gate insulating layer 12 (an extremely thick portion is less likely to be formed unlike in a comparative example described below).

Figure 6B:
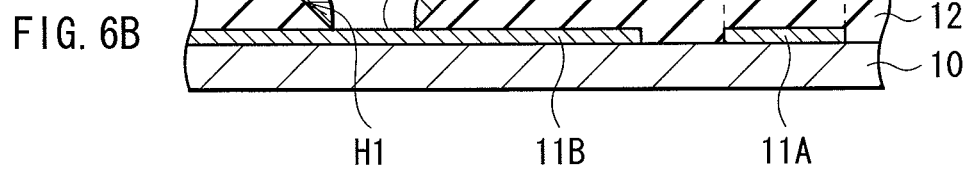

As shown in FIG. 6B, the semiconductor layer 13 is then patterned. In detail, an unnecessary region (13a) is irradiated with laser light L by, for example, a laser ablation process so as to be selectively removed so that the semiconductor layer 13 remains in a desired region (13b1). Here, the semiconductor layer 13 is patterned to remain only in the region opposed to the gate electrode 11A in the transistor section 10A.

At this time, in the embodiment, the semiconductor layer 13 is originally not applied in the region (13b2) opposed to the opening H1; hence, the region 13b2 need not be irradiated with laser, that is, the region 13b2 is not to be patterned. Specifically, the applied semiconductor layer 13 can be patterned across a portion of the semiconductor layer 13 having a substantially uniform thickness on the gate insulating layer 12; hence, the semiconductor layer 13 is accurately processed.

Figure 6C:
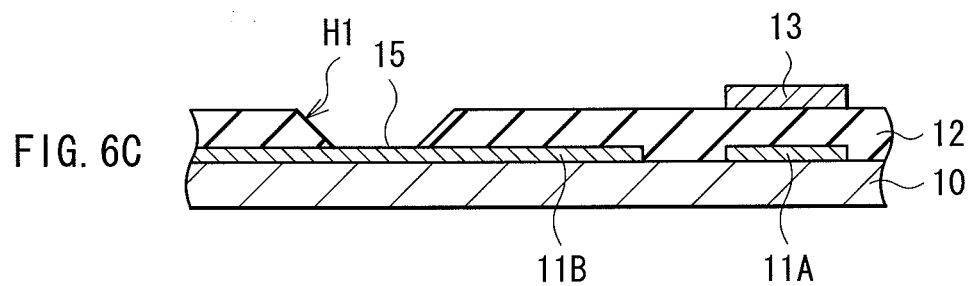

Consequently, as shown in FIG. 6C, the semiconductor layer 13 is formed in the selective region on the gate insulating layer 12. In addition, since the region opposed to the opening H1 is not to be irradiated with laser as described above, the surface-energy control layer 15 is not removed and remains on the surface of the first wiring layer 11B.

Figure 7:
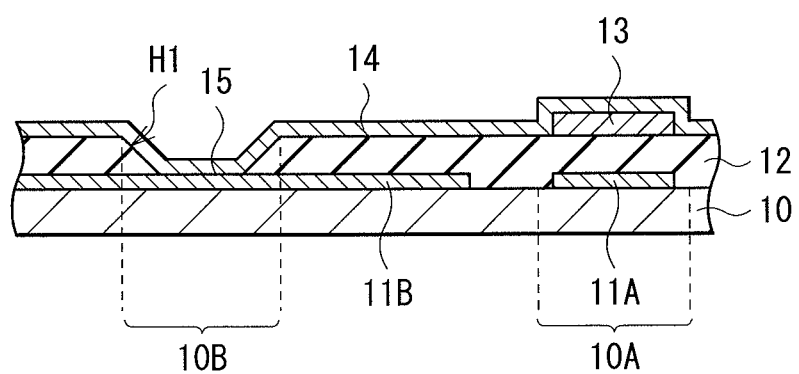
FIG. 7 is a sectional view illustrating a step following FIG. 6C.

Finally, as shown in FIG. 7, the second wiring layer 14 and the source/drain electrodes 14a are collectively formed. In detail, the above-described conductive-film material is deposited over the entire surface of the substrate 10 by, for example, a sputtering process. The deposited film is then etched into a predetermined pattern by, for example, a photolithography process.

In this operation, the second wiring layer is formed to partially extend to the region opposed to the opening H1, so that the first wiring layer 11B is electrically connected to the second wiring layer 14 through the opening H1. In addition, the second wiring layer 14 is formed to partially overlap the semiconductor layer 13 so that such an overlapping portion functions as one of the source/drain electrodes 14a.

Here, since the surface-energy control layer 15 remains on the first wiring layer 11B as described above, the surface-energy control layer 15 is actually interposed between the first wiring layer 11B and the second wiring layer 14. This, however, does not prevent securing the desired electric conductivity. The reason for this is as follows. The surface-energy control layer 15 is formed extremely thin compared with the first wiring layer 11B or the second wiring layer 14, and therefore an increase in electric resistance due to the surface-energy control layer 15 is substantially negligible.

After these steps, the transistor section 10A and the wiring connection section 10B are formed on the substrate 10. This is the end of manufacturing of the circuit board 1 shown in FIG. 1.

[Functions and effects]

The circuit board 1 of the embodiment has the transistor section 10A and the wiring connection section 10B that enables interlayer wiring connection. In detail, the opening H1 is provided in the gate insulating layer 12 in the wiring connection section 10B, so that the first wiring layer 11B is electrically connected to the second wiring layer 14 through the opening H1. Consequently, the circuit board 1 achieves a layer structure preferable for a backplane driving a display described below, for example.

In such a layer structure, the surface-energy control layer 15 is provided in the region opposed to the opening H1 on the first wiring layer 11B, so that the surface energy of the first wiring layer 11B is controlled (wettability of the first wiring layer 11B varies). In detail, the surface-energy control layer 15 in the embodiment functions to control the surface energy of the first wiring layer 11B to be smaller than that of the gate insulating layer 12, that is, to control the first wiring layer 11B to be less wettable than the gate insulating layer 12. As a result, deposition failure is less likely to occur in a formation process of the semiconductor layer 13.

Figure 8:
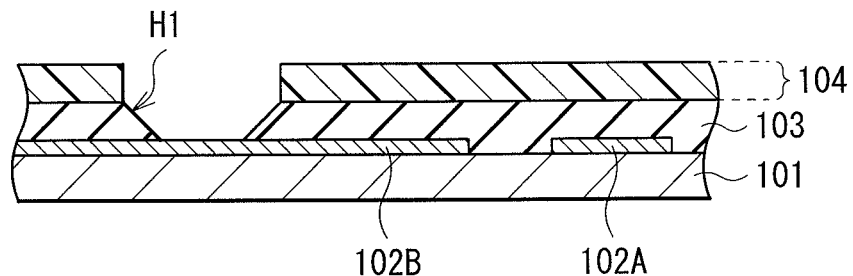
FIG. 8 is a schematic sectional illustration of a method of manufacturing a circuit board according to a comparative example.

A method of manufacturing a circuit board according to a comparative example is now described with reference to FIG. 8 and FIGS. 9A and 9B. In the comparative example, as in the embodiment, a gate electrode 102A and a first wiring layer 102B are formed on a substrate 101, and then a gate insulating layer 103 is formed. As shown in FIG. 8, an opening H1 is then formed using a photoresist film 104. In the comparative example, however, an organic semiconductor material is applied after formation of the opening H1 without silane coupling treatment, namely, without formation of the surface-energy control layer 15, unlike in the embodiment.

Figure 9A:
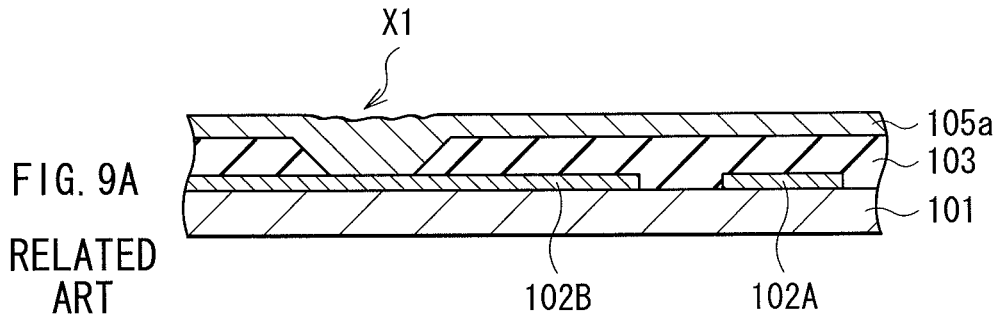
FIGS. 9A and 9B are schematic illustrations of the method of manufacturing the circuit board according to the comparative example.
Figure 9B:
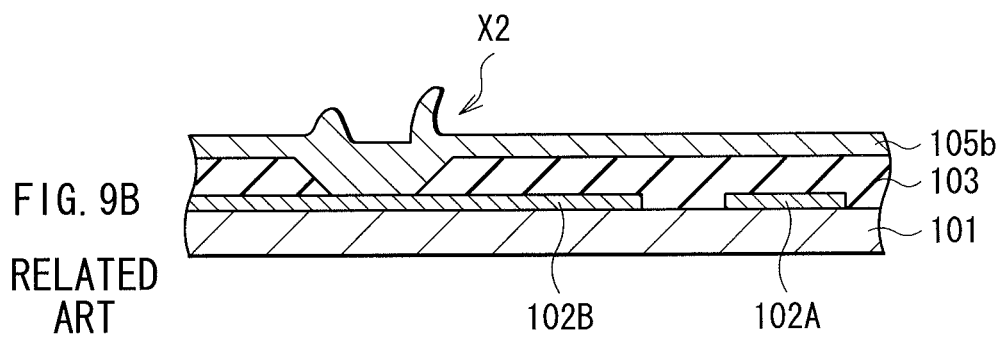

As a result, a relatively thick portion (X1) is formed in the vicinity of the opening H1, for example, as in a semiconductor layer 105a shown in FIG. 9A. Alternatively, thickness unevenness (X2) occurs in the vicinity of the opening H1 as in a semiconductor layer 105b shown in FIG. 9B. In this way, a surface state and a physical shape of the region opposed to the opening H1 for wiring connection are particularly different from those of other regions, causing nonuniform or uneven thickness of the semiconductor layer (105a or 105b). In such a case, patterning of the semiconductor layer is difficult due to the following reason. Specifically, as described above, an unnecessary portion is selectively irradiated with laser light for patterning of the semiconductor layer by a laser ablation process. Hence, if the semiconductor layer is provided in the opening H1 portion, the portion needs to be also irradiated with laser. If the thickness of the semiconductor layer in the vicinity of the opening H1 is large compared with other portions as in the comparative example, accurate patterning of the semiconductor layer is difficult.

In contrast, in the embodiment, the surface-energy control layer 15 is provided on the surface of the first wiring layer 11B exposed from the opening H1 as described in the semiconductor formation process (FIGS. 6A to 6C), so that the semiconductor layer 13 is formed with a substantially uniform thickness on the gate insulating layer 12 other than the opening H1. As a result, for patterning of the semiconductor layer 13, the region (13b2) opposed to the opening H1 need not be irradiated with laser, and patterning can be performed only to the portion having a substantially uniform thickness on the gate insulating layer 12. Consequently, the semiconductor layer 13 is accurately processed. In this way, in the embodiment, the surface-energy control layer 15 is used, so that the semiconductor layer 13 is applied with a substantially uniform thickness on the gate insulating layer 12. This facilitates patterning of the semiconductor layer 13.

As described above, in the embodiment, the second wiring layer 14 is provided on the first wiring layer 11B with the gate insulating layer 12 having the opening H1 therebetween, so that the first wiring layer 11B is electrically connected to the second wiring layer 14 through the opening H1. The surface-energy control layer 15 is provided in the region opposed to the opening H1 on the first wiring layer 11B, so that the surface energy of the first wiring layer 11B is controlled, leading to suppression of deposition failure of the semiconductor layer 13. Consequently, the circuit board 1 enables accurate patterning of the semiconductor layer 13.

A method of manufacturing a circuit board according to each modification (first and second modifications) of the embodiment will now be described. It is to be noted that similar components to those in the embodiment are designated by the same symbols, and description thereof is appropriately omitted.

[First Modification]

Figure 10A:
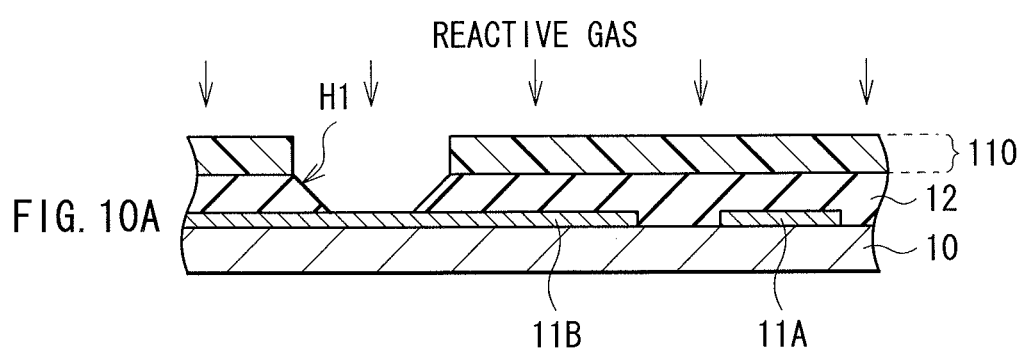
FIGS. 10A and 10B are schematic sectional illustrations of a method of manufacturing a circuit board according to a first modification.
Figure 10B:
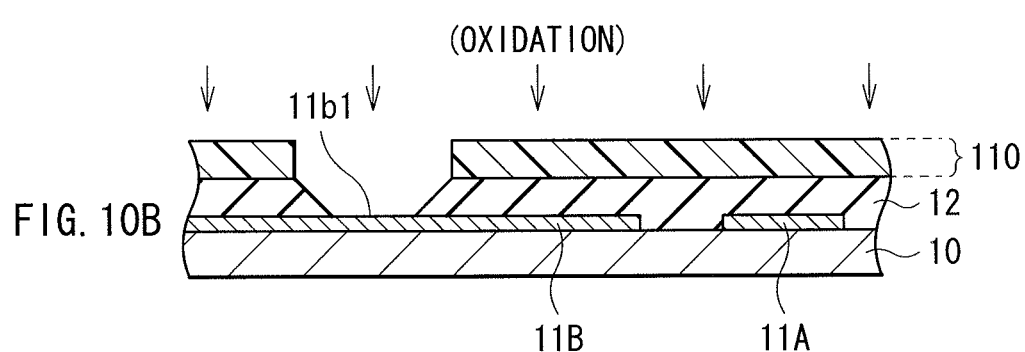

FIGS. 10A and 10B are schematic sectional illustrations of a method of manufacturing a circuit board according to the first modification. In the embodiment, a technique of reacting the oxide film 11b1 on the surface of the first wiring layer 11B with the silane coupling agent has been exemplified as a formation technique of the surface-energy control layer 15. In the technique, although the oxide film 11b1 is formed using oxygen gas used for the dry etching process of the opening H1, the formation technique of the oxide film 11b1 is not limited to this. For example, if oxygen gas is not used as reaction gas for dry etching of the gate insulating layer 12, the oxide film 11b1 can be formed through oxidization (FIG. 10B) of the surface of the first wiring layer 11B after the formation process (FIG. 10A) of the opening H1.

In this way, the formation technique of the oxide film 11b1 on the first wiring layer 11B is not particularly limited. The oxide film 11b1 can be formed, for example, before the silane coupling treatment. In the embodiment, however, the oxide film 11b1 is concurrently formed during the formation process of the opening H1, thus enabling a reduction in the number of steps compared with the first modification.

[Second Modification]

FIGS. 11A and 11B are schematic sectional illustrations of a method of manufacturing a circuit board according to a second modification. In the second modification, as in the embodiment, a surface-energy control layer 25 controlling the surface energy of the first wiring layer 11B is provided in the region opposed to the opening H1 on the surface of the first wiring layer 11B in a layer structure having the transistor section 10A and the wiring connection section 10B on the substrate 10. The surface-energy control layer 25 in the second modification, however, has a function of controlling the surface energy of the first wiring layer 11B to be similar to the surface energy of the gate insulating layer 12 (controlling the surface wettability of the first wiring layer 11B to be substantially equal to that of the gate insulating layer 12), unlike the surface-energy control layer 15 in the embodiment.

In the second modification, as shown in FIG. 11A, the surface-energy control layer 25 is formed in the region opposed to the opening H1 on the surface of the first wiring layer 11B before application of the semiconductor layer 13. As shown in FIG. 11B, a semiconductor material is then applied over the entire surface of the substrate 10. Since, unlike the above-described embodiment, surface wettability is substantially even across the entire region including the region in the vicinity of the opening H1 and the surface of the gate insulating layer 12, the semiconductor layer 13 with a uniform thickness is readily formed across the entire region including the opening H1. As a result, although the opening H1 portion also needs to be irradiated with laser and removed for patterning of the semiconductor layer 13 by the laser ablation process as described above, excellent pattern accuracy is achieved due to the substantially uniform thickness of the semiconductor layer 13 across the entire area on the substrate 10.

APPLICATION EXAMPLES

Figure 12:
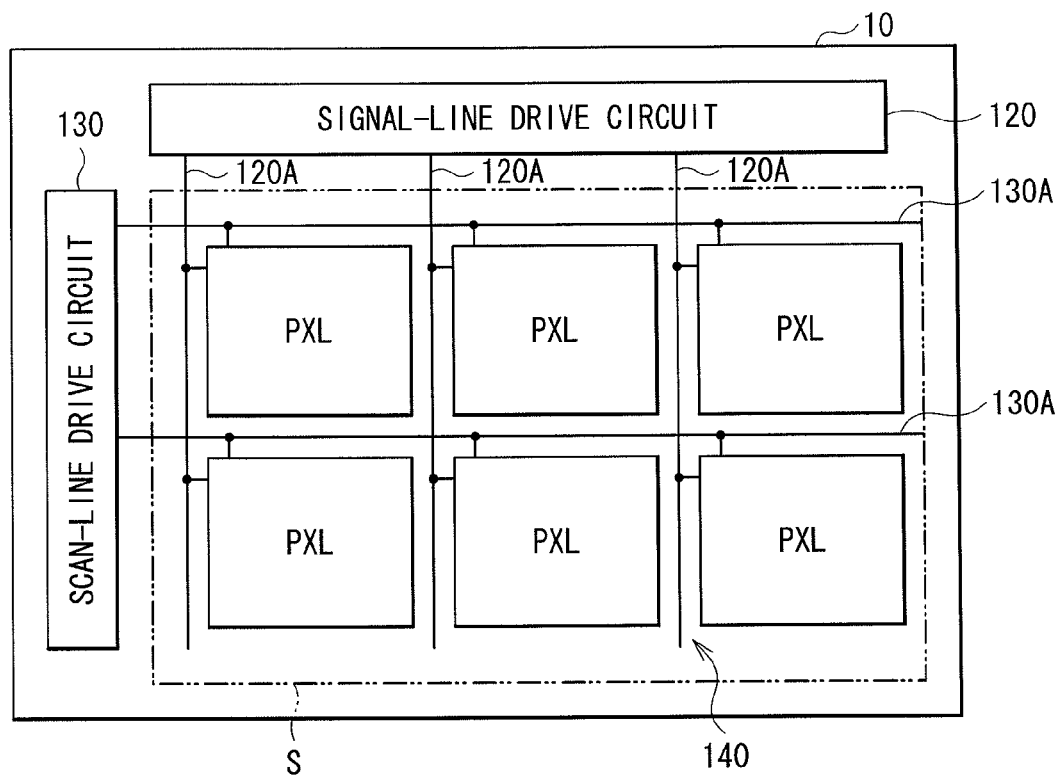
FIG. 12 is a schematic diagram illustrating a drive circuit configuration of a display according to an application example of the circuit board according to each of the embodiment and others.

The circuit board 1 described in the embodiment and the modifications is preferably used as a drive board for a display. Examples of the display include a liquid crystal display, an organic EL display, and an electronic paper display. FIG. 12 schematically illustrates an example of a display drive circuit.

In the drive board, a pixel drive circuit 140 is provided in a display region S on a substrate 10, and a signal-line drive circuit 120 as a driver for image display and a scan-line drive circuit 130 are provided in the periphery of the display region S.

The pixel drive circuit 140 is driven by, for example, an active matrix method. In the pixel drive circuit 140, a plurality of signal lines 120A are arranged along a column direction, and a plurality of scan lines 130A are arranged along a row direction. An intersection of each signal line 120A and each scan line 130A corresponds to a pixel PXL. Each signal line 120A is connected to the signal-line drive circuit 120 that supplies image signals to each pixel PXL through the signal line 120A. Each scan line 130A is connected to the scan-line drive circuit 130 that sequentially supplies scan signals to each pixel PXL through the scan line 130A.

The display including such a circuit board 1 as a drive board is allowed to be mounted on electronic units according to the following application examples 1 to 6. In detail, the display is applicable to electronic units in various fields, including a television apparatus, a digital camera, a notebook personal computer, a mobile terminal unit such as a mobile phone and a smartphone, and a video camcorder. In other words, the display is applicable to electronic units in various fields for displaying externally-received or internally-generated image signals as still or video images.

Application Example 1

Figure 13:
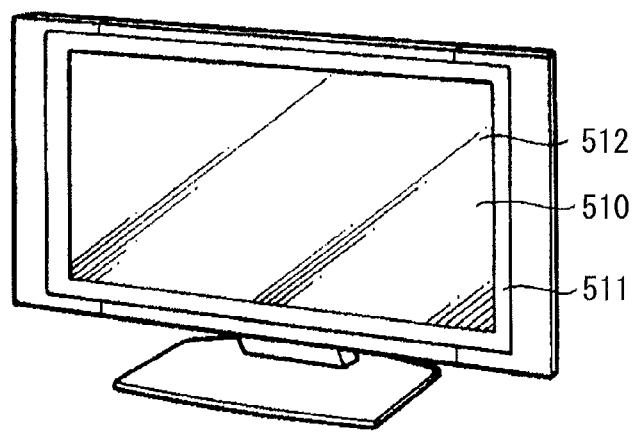
FIG. 13 is a perspective view illustrating appearance of application example 1 of the circuit board according to each of the embodiment and others.

FIG. 13 illustrates appearance of a television apparatus according to application example 1. The television apparatus has, for example, an image display screen section 510 including a front panel 511 and filter glass 512. The image display screen section 510 corresponds to the above-described display.

Application Example 2

Figure 14A:
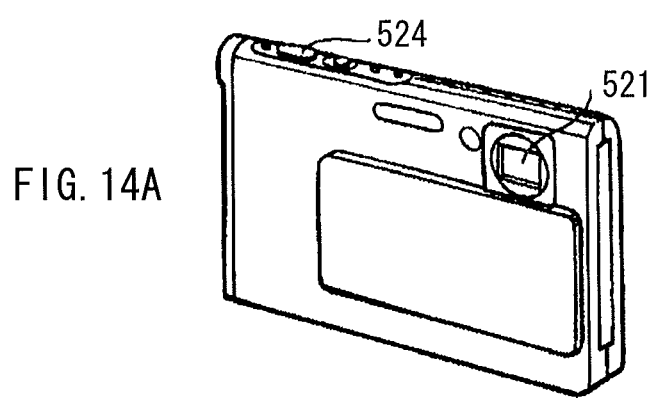
FIG. 14A is a perspective view illustrating appearance of application example 2 as viewed from its front side.
Figure 14B:
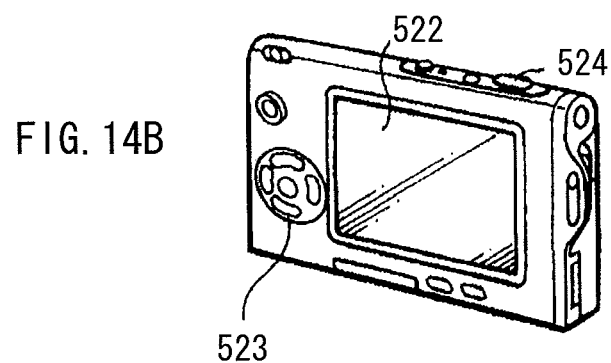
FIG. 14B is a perspective view illustrating appearance thereof as viewed from its back side.

FIGS. 14A and 14B illustrate appearance of a digital camera according to application example 2. The digital camera has, for example, a light emitting section for flash 521, a display section 522 as the above-described display, a menu switch 523, and a shutter button 524.

Application Example 3

Figure 15:
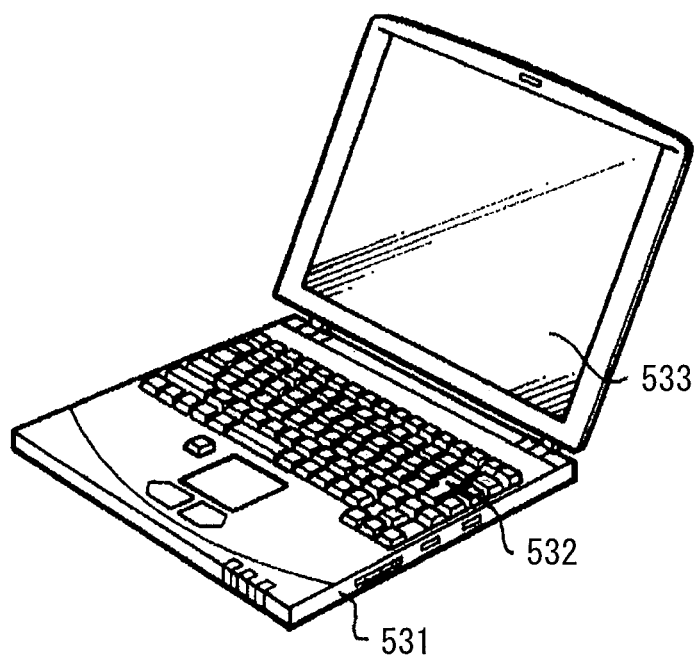
FIG. 15 is a perspective view illustrating appearance of application example 3.

FIG. 15 illustrates appearance of a notebook personal computer according to application example 3. The notebook personal computer has, for example, a main body 531, a keyboard 532 for input operation of characters and the like, and a display section 533 as the above-described display.

Application Example 4

Figure 16:
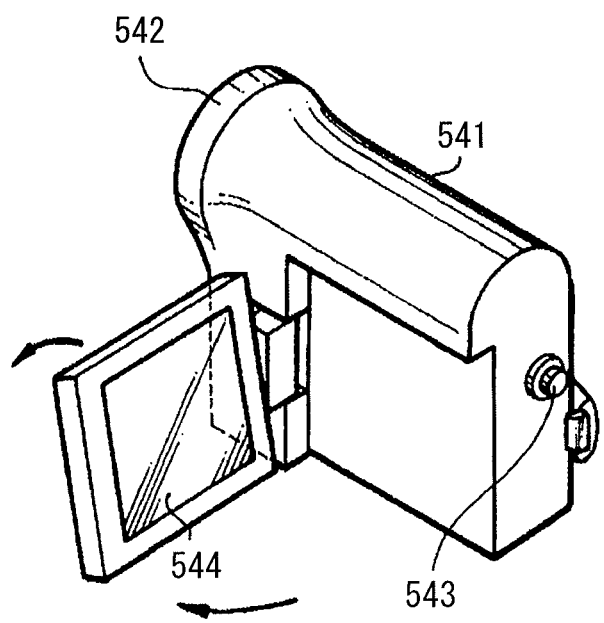
FIG. 16 is a perspective view illustrating appearance of application example 4.

FIG. 16 illustrates appearance of a video camcorder according to application example 4. The video camcorder has, for example, a main body section 541, an object-shooting lens 542 provided on a front side face of the main body section 541, a start/stop switch 543 for shooting, and a display section 544 as the above-described display.

Application Example 5

FIGS. 17A to 17G illustrate appearance of a mobile phone according to application example 5. For example, the mobile phone is configured of an upper housing 710 and a lower housing 720 connected to each other by a hinge section 730, and has a display 740, a sub-display 750, a picture light 760, and a camera 770. The display 740 or the sub-display 750 corresponds to the above-described display.

Application Example 6

Figure 18A:
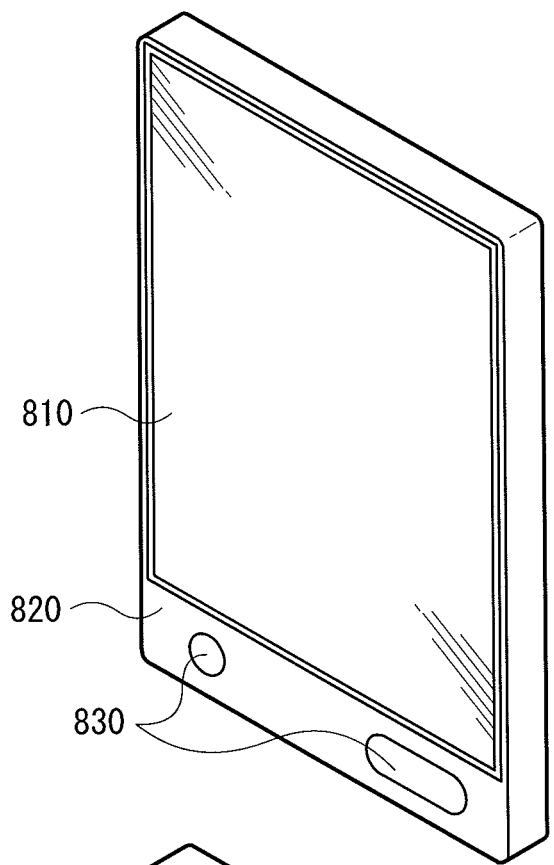
FIGS. 18A and 18B are perspective views illustrating appearance of application example 6.
Figure 18B:
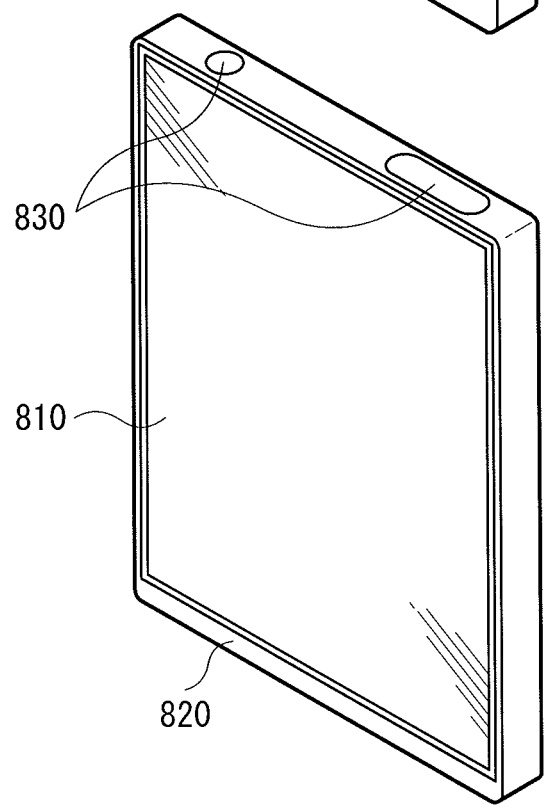

FIGS. 18A and 18B illustrate appearance of a smartphone according to application example 6. The smartphone has, for example, a display section 810, a non-display section 820, and an operational section 830. As shown in FIG. 18A, the operational section 830 can be provided on the same face (front face) as that of the display section 810, or as shown in FIG. 18B, can be provided on a face (top) different from that of the display section 810.

Although the disclosure has been described with the embodiment, the modifications, and the application examples hereinbefore, the content of the disclosure is not limited to the embodiment and others, and various modifications or alterations may be made. For example, the organic TFT having a bottom-gate structure and a top-contact structure has been exemplified as the thin film transistor (transistor section 10A) provided in the circuit board in the embodiment and others, the thin film transistor can have a top-gate structure and a bottom-contact structure. In addition, the circuit board of the disclosure is allowed to be applied not only to the organic TFT but also to a thin film transistor including an inorganic semiconductor or an oxide semiconductor.

In addition, although a case where the semiconductor layer in the disclosure functions as a channel of a thin film transistor has been exemplified in the embodiment and others, the semiconductor device provided in the circuit board can include other active devices such as a diode without limitation. For example, in the case where the circuit board is used as a backplane, the circuit board of the disclosure is allowed to be applied to general circuit boards including semiconductor devices involving interlayer wiring connection.

Furthermore, although the layer structure, where the first wiring layer 11B and the second wiring layer 14 provided in different layers are electrically connected to each other, has been exemplified in the embodiment and others, the circuit board of the disclosure is allowed to be applied to a layer structure having wiring layers provided in three or more, different layers. Two or more wiring layers, among the three or more wiring layers, should be electrically connected to each other, and three or more wiring layers can be electrically connected to one another.

It is possible to achieve at least the following configurations from the above-described exemplary embodiments and the modifications of the disclosure.

(1) A circuit board, including:
  a first wiring layer provided on a substrate;
  an insulating layer including an opening, the insulating layer being provided on the first wiring layer;
  a surface-energy control layer provided in a region opposed to the opening of the insulating layer on the first wiring layer, the surface-energy control layer controlling surface energy of the first wiring layer;
  a semiconductor layer provided in a selective region on the insulating layer; and
  a second wiring layer on the insulating layer, the second wiring layer being electrically connected to the semiconductor layer, and being electrically connected to the first wiring layer through the opening.

(2) The circuit board according to (1), wherein the surface-energy control layer has a function of controlling a surface of the first wiring layer to be less wettable than a surface of the insulating layer.

(3) The circuit board according to (1), wherein the surface-energy control layer has a function of controlling wettability of a surface of the first wiring layer to be substantially equal to wettability of a surface of the insulating layer.

(4) The circuit board according to any one of (1) to (3), wherein
  one or a plurality of thin film transistors are provided on the substrate,
  each of the thin film transistors including
    the semiconductor layer as a channel layer, a gate electrode provided in the same layer as the first wiring layer, and disposed to be opposed to the semiconductor layer with the insulating layer therebetween, and a source electrode and a drain electrode each provided as a part of the second wiring layer, or provided in the same layer as the second wiring layer.

(5) The circuit board according to any one of (1) to (4), wherein the semiconductor layer is configured of an organic semiconductor.

(6) The circuit board according to (4) or (5), wherein the circuit board is a backplane having the thin film transistor.

(7) A method of manufacturing a circuit board, the method including:

forming a first wiring layer on a substrate;

forming an insulating layer having an opening on the first wiring layer;

forming a surface-energy control layer in a region opposed to the opening of the insulating layer on the first wiring layer, the surface-energy control layer controlling surface energy of the first wiring layer;

forming a semiconductor layer in a selective region on the insulating layer after forming the surface-energy control layer; and forming a second wiring layer on the insulating layer, the second wiring layer being electrically connected to the semiconductor layer, and electrically connected to the first wiring layer through the opening.

(8) The method according to (7), wherein the surface-energy control layer functions to control a surface of the first wiring layer to be less wettable than a surface of the insulating layer.

(9) The method according to (7) or (8), wherein during or after the formation of the insulating layer, an oxide film is formed in the region opposed to the opening on the surface of the first wiring layer, and the oxide film is subjected to silane coupling treatment to form the surface-energy control layer.

(10) The method according to any one of (7) to (9), wherein during the formation of the insulating layer, the oxide film is formed along with formation of the opening by dry etching using oxygen gas.

(11) The method according to (7), wherein the surface-energy control layer functions to control wettability of a surface of the first wiring layer to be substantially equal to wettability of a surface of the insulating layer.

(12) The method according to any one of (7) to (11), wherein during the formation of the semiconductor layer, an organic semiconductor is deposited by a coating process over an entire surface of the insulating layer, and then the deposited organic semiconductor is patterned.

(13) The method according to (12), wherein the semiconductor layer is patterned by a laser aberration process.

(14) A display, including:

a display section including a plurality of pixels; and a circuit board driving the display section, wherein the circuit board includes a first wiring layer provided on a substrate, an insulating layer including an opening, the insulating layer being provided on the first wiring layer, a surface-energy control layer provided in a region opposed to the opening of the insulating layer on the first wiring layer, the surface-energy control layer controlling surface energy of the first wiring layer, a semiconductor layer provided in a selective region on the insulating layer, and a second wiring layer on the insulating layer, the second wiring layer being electrically connected to the semiconductor layer, and being electrically connected to the first wiring layer through the opening.

(15) The display according to (14), wherein the circuit board includes one or a plurality of thin film transistors on the substrate, each of the thin film transistors including the semiconductor layer as a channel layer, a gate electrode provided in the same layer as the first wiring layer, and disposed to be opposed to the semiconductor layer with the insulating layer therebetween, and a source electrode and a drain electrode each provided as a part of the second wiring layer, or provided in the same layer as the second wiring layer.

(16) The display according to (14) or (15), wherein the semiconductor layer is configured of an organic semiconductor.

(17) The display according to any one of (14) to (16), wherein the circuit board is a backplane having the thin film transistor.

(18) An electronic unit, including:

a display including a display section including a plurality of pixels, and a circuit board driving the display section, wherein the circuit board includes a first wiring layer provided on a substrate, an insulating layer including an opening, the insulating layer being provided on the first wiring layer, a surface-energy control layer provided in a region opposed to the opening of the insulating layer on the first wiring layer, the surface-energy control layer controlling surface energy of the first wiring layer, a semiconductor layer provided in a selective region on the insulating layer, and a second wiring layer on the insulating layer, the second wiring layer being electrically connected to the semiconductor layer, and being electrically connected to the first wiring layer through the opening.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A circuit board, comprising:

a first wiring layer provided on a substrate;

an insulating layer including an opening, the insulating layer being provided on the first wiring layer;

a surface-energy control layer provided in a region opposed to the opening of the insulating layer on the first wiring layer, the surface-energy control layer controlling surface energy of the first wiring layer;

a semiconductor layer provided in a selective region on the insulating layer; and a second wiring layer on the insulating layer, the second wiring layer being electrically connected to the semiconductor layer, and being electrically connected to the first wiring layer through the opening.

2. The circuit board according to claim 1, wherein the surface-energy control layer has a function of controlling a surface of the first wiring layer to be less wettable than a surface of the insulating layer.

3. The circuit board according to claim 1, wherein the surface-energy control layer has a function of controlling wettability of a surface of the first wiring layer to be substantially equal to wettability of a surface of the insulating layer.

4. The circuit board according to claim 1, wherein
one or a plurality of thin film transistors are provided on the substrate,
each of the thin film transistors including
the semiconductor layer as a channel layer,
a gate electrode provided in the same layer as the first wiring layer, and disposed to be opposed to the semiconductor layer with the insulating layer therebetween, and
a source electrode and a drain electrode each provided as a part of the second wiring layer, or provided in the same layer as the second wiring layer.

5. The circuit board according to claim 1, wherein the semiconductor layer is configured of an organic semiconductor.

6. The circuit board according to claim 4, wherein the circuit board is a backplane having the thin film transistor.

7. A method of manufacturing a circuit board, the method comprising:
forming a first wiring layer on a substrate;
forming an insulating layer having an opening on the first wiring layer;
forming a surface-energy control layer in a region opposed to the opening of the insulating layer on the first wiring layer, the surface-energy control layer controlling surface energy of the first wiring layer;
forming a semiconductor layer in a selective region on the insulating layer after forming the surface-energy control layer; and
forming a second wiring layer on the insulating layer, the second wiring layer being electrically connected to the semiconductor layer, and electrically connected to the first wiring layer through the opening.

8. The method according to claim 7, wherein the surface-energy control layer functions to control a surface of the first wiring layer to be less wettable than a surface of the insulating layer.

9. The method according to claim 8, wherein
during or after the formation of the insulating layer,
an oxide film is formed in the region opposed to the opening on the surface of the first wiring layer, and
the oxide film is subjected to silane coupling treatment to form the surface-energy control layer.

10. The method according to claim 9, wherein
during the formation of the insulating layer,
the oxide film is formed along with formation of the opening by dry etching using oxygen gas.

11. The method according to claim 7, wherein the surface-energy control layer functions to control wettability of a surface of the first wiring layer to be substantially equal to wettability of a surface of the insulating layer.

12. The method according to claim 7, wherein
during the formation of the semiconductor layer,
an organic semiconductor is deposited by a coating process over an entire surface of the insulating layer, and then the deposited organic semiconductor is patterned.

13. The method according to claim 12, wherein the semiconductor layer is patterned by a laser aberration process.

14. A display, comprising:
a display section including a plurality of pixels; and
a circuit board driving the display section, wherein
the circuit board includes
a first wiring layer provided on a substrate,
an insulating layer including an opening, the insulating layer being provided on the first wiring layer,
a surface-energy control layer provided in a region opposed to the opening of the insulating layer on the first wiring layer, the surface-energy control layer controlling surface energy of the first wiring layer,
a semiconductor layer provided in a selective region on the insulating layer, and
a second wiring layer on the insulating layer, the second wiring layer being electrically connected to the semiconductor layer, and being electrically connected to the first wiring layer through the opening.

15. The display according to claim 14, wherein
the circuit board includes one or a plurality of thin film transistors on the substrate,
each of the thin film transistors including
the semiconductor layer as a channel layer,
a gate electrode provided in the same layer as the first wiring layer, and disposed to be opposed to the semiconductor layer with the insulating layer therebetween, and
a source electrode and a drain electrode each provided as a part of the second wiring layer, or provided in the same layer as the second wiring layer.

16. The display according to claim 14, wherein the semiconductor layer is configured of an organic semiconductor.

17. The display according to claim 15, wherein the circuit board is a backplane having the thin film transistor.

18. An electronic unit, comprising:
a display including a display section including a plurality of pixels, and a circuit board driving the display section, wherein
the circuit board includes
a first wiring layer provided on a substrate,
an insulating layer including an opening, the insulating layer being provided on the first wiring layer,
a surface-energy control layer provided in a region opposed to the opening of the insulating layer on the first wiring layer, the surface-energy control layer controlling surface energy of the first wiring layer,
a semiconductor layer provided in a selective region on the insulating layer, and
a second wiring layer on the insulating layer, the second wiring layer being electrically connected to the semiconductor layer, and being electrically connected to the first wiring layer through the opening.

* * * * *